United States Patent
Maeng et al.

(10) Patent No.: US 9,355,693 B2
(45) Date of Patent: May 31, 2016

(54) MEMORY RECEIVER CIRCUIT FOR USE WITH MEMORY OF DIFFERENT CHARACTERISTICS

(71) Applicant: Intel Corporation, Santa Clara, CA (US)

(72) Inventors: Moonkyun Maeng, El Dorado Hills, CA (US); Aaron Martin, El Dorado Hills, CA (US); Hsiao-Ching Chuang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 352 days.

(21) Appl. No.: 13/830,637

(22) Filed: Mar. 14, 2013

(65) Prior Publication Data
US 2014/0269130 A1  Sep. 18, 2014

(51) Int. Cl.
| G11C 7/06 | (2006.01) |
| G11C 7/10 | (2006.01) |
| G11C 5/14 | (2006.01) |
| G11C 16/28 | (2006.01) |

(52) U.S. Cl.
CPC .................................. G11C 7/1084 (2013.01)

(58) Field of Classification Search
CPC ........ G11C 7/062; G11C 7/065; G11C 7/067; G11C 7/1084; G11C 7/1051; G11C 7/1057; G11C 2207/063; G11C 5/147; G11C 16/28
See application file for complete search history.

(56) References Cited

U.S. PATENT DOCUMENTS

| 4,334,317 A * | 6/1982 | Beesley ................. H03G 3/345 455/194.1 |
| 4,590,394 A * | 5/1986 | Pace ........................ H03G 11/06 327/309 |
| 4,724,437 A * | 2/1988 | Jones ..................... G01S 13/586 342/101 |
| 4,866,261 A * | 9/1989 | Pace ..................... H03M 1/1295 327/552 |
| 5,463,345 A * | 10/1995 | Nagahori et al. ............. 327/374 |
| 5,686,898 A * | 11/1997 | Willard ............... H04W 88/026 340/2.4 |
| 5,812,023 A * | 9/1998 | Jones ...................... H03F 1/303 327/337 |

(Continued)

Primary Examiner — Hoai V Ho
Assistant Examiner — Roberto Mancera
(74) Attorney, Agent, or Firm — Schwabe, Williamson & Wyatt, P.C.

(57) ABSTRACT

Embodiments include systems, methods, and apparatuses for reading a data signal from a memory, such as a dynamic random access memory (DRAM). In one embodiment, a memory receiver may include a differential amplifier to receive a data signal from the memory and pass a differential output signal based on a voltage difference between the data signal and a reference voltage. The data signal may have a first direct current (DC) average voltage level, and the differential amplifier may shift the differential output signal to a second DC average voltage level that is substantially constant over a range of values of the first DC average voltage level. In another embodiment, a voltage offset compensation (VOC) circuit may apply a compensation voltage to the output signal that is based on an activated rank or an identity of the memory module. Other embodiments may be described and claimed.

10 Claims, 6 Drawing Sheets

(56) References Cited

U.S. PATENT DOCUMENTS

| | | | |
|---|---|---|---|
| 6,396,329 B1* | 5/2002 | Zerbe | G11C 7/02 327/319 |
| 7,391,829 B2* | 6/2008 | Tripathi | H03H 21/0001 330/254 |
| 7,983,647 B2* | 7/2011 | Choi | H04B 1/7107 375/340 |
| 8,106,685 B2* | 1/2012 | Cheng | 327/108 |
| 8,116,048 B1* | 2/2012 | Gallerano et al. | 361/56 |
| 8,493,801 B2* | 7/2013 | Dreps et al. | 365/193 |
| 8,867,595 B1* | 10/2014 | Luo et al. | 375/224 |
| 8,884,690 B2* | 11/2014 | Pan et al. | 327/563 |
| 2004/0109516 A1* | 6/2004 | O'Shea | H04L 25/061 375/340 |
| 2007/0057723 A1* | 3/2007 | Pan et al. | 330/252 |
| 2013/0285726 A1* | 10/2013 | Roytman | H03K 5/26 327/175 |

* cited by examiner

MEMORY RECEIVER CIRCUIT FOR USE WITH MEMORY OF DIFFERENT CHARACTERISTICS

FIELD

Embodiments of the present invention relate generally to the technical field of memory. Specific embodiments relate to memory receivers, e.g., in a memory controller, for use with memory of different characteristics.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Information stored in a memory, such as a dynamic random access memory (DRAM) may be read by a receiver circuit in a memory controller hub (MCH) by comparing a data signal from the memory to a reference voltage. The data signal may generally have a first voltage level to represent a first logical value (e.g., a logic 0), and a second voltage level to represent a second logical value (e.g., a logic 1). The reference voltage is typically set at the average DC voltage level of the data signal, between the first and second voltage levels. However, the average DC voltage level can vary for memory of different characteristics (e.g., memory that follows a different memory protocol, different memory ranks of a dual inline memory module (DIMM), different configurations of the DIMM and/or differences between memory of different manufacturers).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smartphone (which may include one or more processors), a tablet, laptop computer, a set-top box, a gaming console, and so forth.

Figure 1:
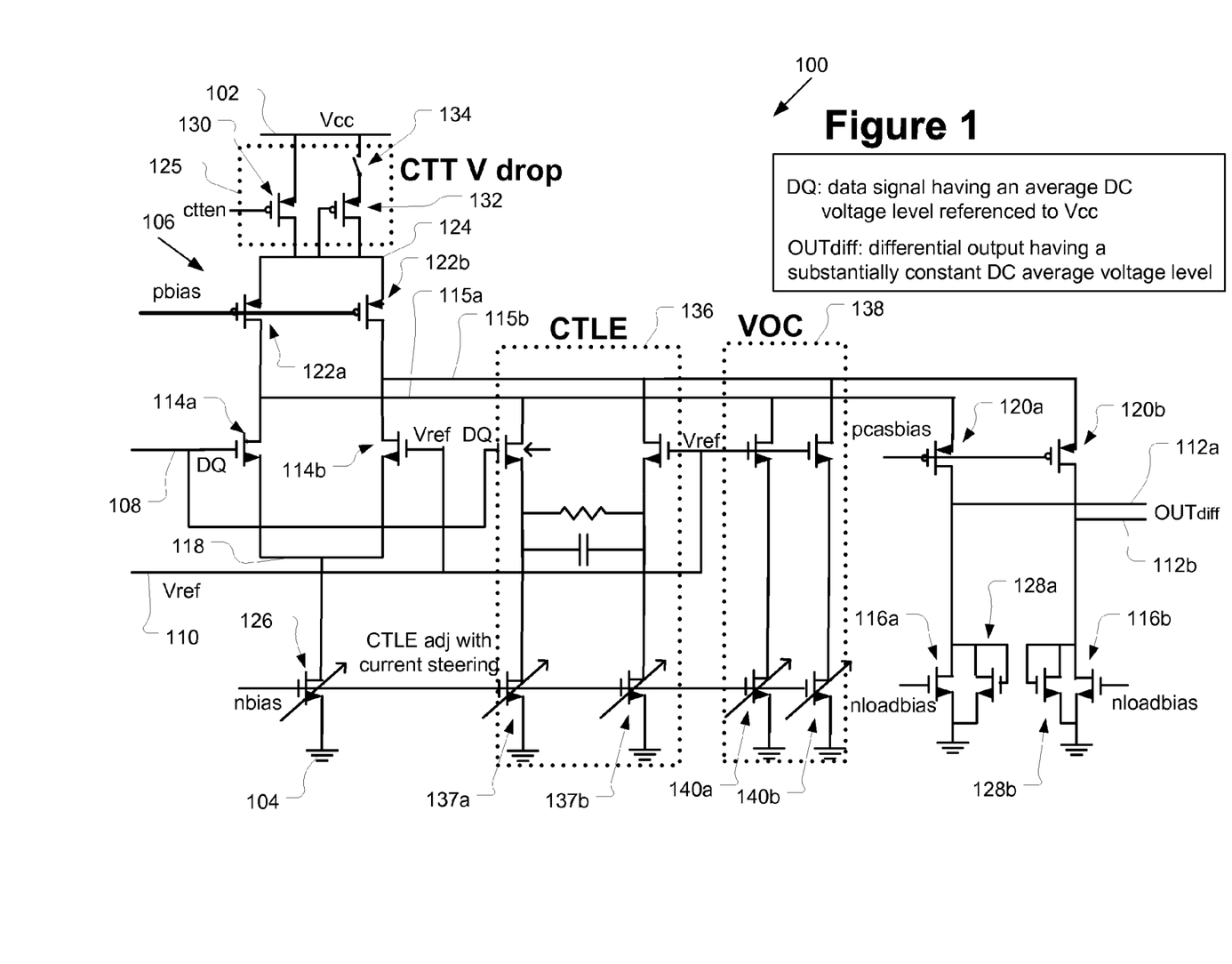
FIG. 1 illustrates an example memory receiver circuit, in accordance with various embodiments.

FIG. 1 illustrates a memory receiver circuit 100 (hereinafter "circuit 100") in accordance with various embodiments. Circuit 100 may be configured to receive data from a memory, such as a dynamic random access memory (DRAM). In some embodiments, the circuit 100 may be included in a memory controller hub (MCH) coupled to and/or included in a processor. The circuit may include a positive supply rail 102 configured to receive a positive supply voltage Vcc. The circuit may further include a negative supply rail 104 configured to receive a negative supply voltage Vss. In some embodiments, the negative supply voltage may be a ground voltage as shown in FIG. 1.

In various embodiments, the circuit 100 may include a differential amplifier 106 coupled to the positive supply rail 102 and/or the negative supply rail 104. The differential amplifier 106 may receive a data signal DQ at an input terminal 108 of the differential amplifier 106. The differential amplifier 106 may further receive a reference voltage (Vref) at a reference input terminal 110. The differential amplifier 106 may generate a differential output signal based on a voltage difference between the data signal DQ and the reference voltage Vref. The differential amplifier 106 may pass the differential output signal to a pair of output terminals 112a and 112b via a differential signal path 115a-b.

In various embodiments, the data signal DQ received by the differential amplifier 106 may have a first direct current (DC) average voltage level. The differential amplifier 106 may shift the differential output signal to a second DC average voltage level. In some embodiments, the second DC average voltage level may be substantially constant over a range of values of the first DC average voltage level. Additionally, or alternatively, the first DC average voltage level may be referenced to the positive supply voltage Vcc, and the second DC average voltage level may be referenced to the negative supply voltage Vss (e.g., ground). Accordingly, the circuit 100 may be used with memory that use data signals of different DC average voltage levels.

For example, the circuit 100 may be used with DRAM in accordance with a double data rate (DDR) 3 protocol and with DRAM in accordance with a DDR4 protocol. The data signal of DDR3 DRAM may have a DC average voltage level of about one-half of the positive supply voltage (e.g., ½Vcc). For example, DDR3 DRAM may use center-tap-termination (CTT). However, the data signal of DDR4 DRAM may have a higher DC average voltage level, such as about three-fourths of the positive supply voltage (e.g., ¾Vcc). Additionally, the DC average voltage level of DDR4 DRAM may vary over different memory ranks or memory configurations.

Furthermore, different memory types may use a different power domain (e.g., with different values of the positive supply voltage). For example, the positive supply voltage for DDR3 memory may be 1.5 volts (V) or 1.35V, and the positive supply voltage for DDR4 memory may be 1.2V in some embodiments. The circuit 100 may produce an output signal with a constant DC average voltage level (e.g., the second DC average voltage level) that is independent of the input voltage level (e.g., the first DC average voltage level). Additionally, or alternatively, as discussed above, the second DC average voltage level may be referenced to the negative supply voltage Vss (e.g., ground) rather than the positive supply voltage Vcc. Accordingly, the circuit 100 may be used with different memory types that may operate using different power domains and may have different DC average voltage levels of the respective data signals DQ.

In various embodiments, the circuit 100 may use the same power domain as the memory (e.g., the positive supply voltage Vcc at the positive supply rail 102 may be the same as the positive supply voltage of the memory). The circuit 100 may pass the differential output signal to further circuitry that may operate on a different power domain (e.g., at a lower positive supply voltage). For example, in some embodiments, the circuit 100 may be a first-stage amplifier of a memory receiver (e.g., a DRAM receiver). The circuit 100 may pass the differential output signal to a second-stage amplifier of the memory receiver for further processing. The second-stage amplifier may operate using a power domain that is different from the power domain used by the circuit 100 and the memory.

As discussed above, the differential output signal produced by the differential amplifier 106 may be based on a voltage difference between the data signal and the reference voltage. The differential output signal may generally be greater than the second DC average voltage if the data signal is greater than the reference voltage (e.g., representing a first logic value) and less than the second DC average voltage if the data signal is less than the reference voltage (e.g., representing a second logic value).

In some embodiments, as shown in FIG. 1, the differential amplifier 106 may include a differential pair of transistors 114a-b with folded architecture (e.g., with transistors 116a-b and/or 128a-b coupled between the respective output terminals 112a-b and ground), as shown in FIG. 1. A bias circuit (e.g., bias circuit 200 shown in FIG. 2 and discussed further below) may generate a plurality of bias voltages for use by the differential amplifier 106 to provide the differential output signal with the second average DC voltage.

In some embodiments, the transistors 114a-b of the differential pair may be n-type transistors. The respective source terminals of the n-type transistors 114a-b may be coupled to one another at a common node 118. Transistor 114a may receive the data signal DQ at the gate of the transistor 114a. Transistor 114b may receive the reference voltage at the gate of transistor 114b. The drain of transistor 114a may be coupled to output terminal 112a via signal path 115a, and the drain of transistor 114b may be coupled to output terminal 112b via signal path 115b. In some embodiments, a cascode transistor 120a may be coupled between the drain of transistor 114a and the output terminal 112a, and a cascode transistor 120b may be coupled between the drain of transistor 114b and the output terminal 112b. Cascode transistors 120a-b may be p-type transistors in some embodiments. Cascode transistors 120a-b may receive a cascode bias voltage from the bias circuit at their respective gate terminals. Cascode transistors 120a-b may facilitate input-output isolation, among other benefits.

The differential amplifier 106 may further include p-type transistors 122a-b. The respective drains of the p-type transistors 122a-b may be coupled to the respective drains of the n-type transistors 114a-b, and the sources of the p-type transistors 122a-b may be coupled to one another at a common node 124. The common node 124 may be coupled to the positive supply rail 102. In some embodiments, a voltage drop block 125, which is discussed further below, may be coupled between the common node 124 and the positive supply rail 102. The p-type transistors 122a-b may receive a pbias voltage from the bias circuit at their respective gate terminals.

In various embodiments, the differential amplifier 106 may further include a current source 126 coupled between the common node 118 and the negative supply rail 104 (e.g., the ground terminal). The current source 126 may be controllable, as further discussed below, to regulate the voltage level of the differential output signal. In some embodiments, the current source 126 may include one or more transistors (e.g., n-type transistors), as shown in FIG. 1. For example, the current source 126 may include a bank of transistors coupled in parallel with one another and coupled between the common node 118 and the negative supply rail 104. The current source 126 may be controlled by an nbias voltage, which may be generated by the bias circuit. The controllable current source 126 and p-type transistors 122a-b may be controlled by the respective bias voltages to supply current through the differential pair of transistors 114a-b so that the differential output signal is maintained at the second DC average voltage level.

In some embodiments, the n-type transistors 116a-b coupled in parallel with diode-connected transistors 128a-b may form a load of the differential amplifier of 106. The transistors 116a-b may receive an nloadbias voltage from the bias circuit at respective gate terminals. The load transistors 116a-b and 128a-b may facilitate the shifting of the differential output signal to the second DC average voltage and/or the referencing of the differential output signal to the negative supply voltage Vss (e.g., ground).

As mentioned above, in some embodiments, the circuit 100 may include a voltage drop block 125 coupled between the positive supply rail 102 and the differential amplifier 106 (e.g., between the positive supply rail 102 and the common node 124). The voltage drop block 125 may selectively provide a voltage drop from the positive supply rail 102 to the common node 124 of the differential amplifier 106 during a first mode of the circuit 100. The first mode may be used for memory that uses CTT, such as DDR3 DRAM. The voltage drop may reduce the risk of electrical overstress (EOS) for the differential amplifier 106.

In a second mode of the circuit 100, the voltage drop block 125 may not provide a voltage drop from the positive supply rail 102 to the common node 124. Instead, the voltage drop block 125 may pass the positive supply voltage to the common node 124. The second mode may be used with memory that use a higher average DC voltage level relative to the positive supply voltage, such as DDR4 DRAM, to provide sufficient headroom. The positive supply voltage may be lower in the second mode (e.g., 1.2V), so the EOS risk is reduced.

The voltage drop block 125 may include any suitable structure to selectively provide a voltage drop during the first mode. For example, as shown in FIG. 1, the voltage drop block 125 may include a diode-connected transistor 132 (e.g., a p-type transistor) coupled between the positive supply rail 102 and the common node 124 to provide the voltage drop during the first mode. The transistor 130 may receive an enable signal "ctten" at the gate of the transistor 130 to facilitate the voltage drop of transistor 132. For example, the transistor 130 may be off (e.g., not conducting) when the voltage drop block is in the first mode. In some embodiments, the voltage of the ctten signal may be set by a basic input-output system (BIOS) coupled to the circuit 100. The precise amount of the voltage drop provided by the transistor 132 may not significantly affect the performance of the differential amplifier 106.

The voltage drop block 125 may further include a switch 134 between the positive supply rail 102 and the common node 124 in series with transistor 132. The switch 134 may be closed (i.e. switch 134 is conducting) during the first mode to allow the transistor 132 to provide a voltage drop from the positive supply rail 102 and the common node 124 while the transistor 130 may not be conducting. The switch 134 may be opened (i.e. switch 134 is not conducting) during the second mode to bypass the voltage drop and pass the positive supply voltage to the common node 124 by conducting transistor 130. In some embodiments, the voltage drop block 125 may be set to the first mode or second mode by the BIOS, and the switch 134 may be opened or closed accordingly.

In some embodiments, the circuit 100 may further include continuous time linear equalization (CTLE) circuitry 136 coupled to the differential amplifier 106 (e.g., between the drains of the differential pair of transistors 114a-b and the output terminals 112a-b). CTLE circuitry 136 may equalize channel loss to prevent and/or reduce inter-symbol interference. CTLE circuitry 136 may include current steering transistors 137a-b to facilitate the equalization.

In some embodiments, the circuit 100 may further include a voltage offset compensation (VOC) circuit 138 coupled to the differential amplifier 106 (e.g., between the drains of the differential pair of transistors 114a-b and the output terminals 112a-b). The VOC circuit 138 may apply a compensation voltage to the differential output signal to compensate for internal offset of the circuit 100 (e.g., silicon offset) or channel offset (e.g. as further discussed below). The VOC circuit 138 may include a transistor bank 140a coupled between the signal path 115a and ground, and a transistor bank 140b coupled between the signal path 115b and ground. The transistor banks 140a-b may each include a plurality of transistors coupled in series with one another. The individual transistors of the transistor banks 140a-b may be individually controlled to provide the compensation voltage.

In some embodiments, the compensation voltage may also include a rank adjustment voltage that is based on an activated memory rank or identity of the memory module. These embodiments are discussed further below with respect to FIGS. 3, 4, and 5.

Figure 2:
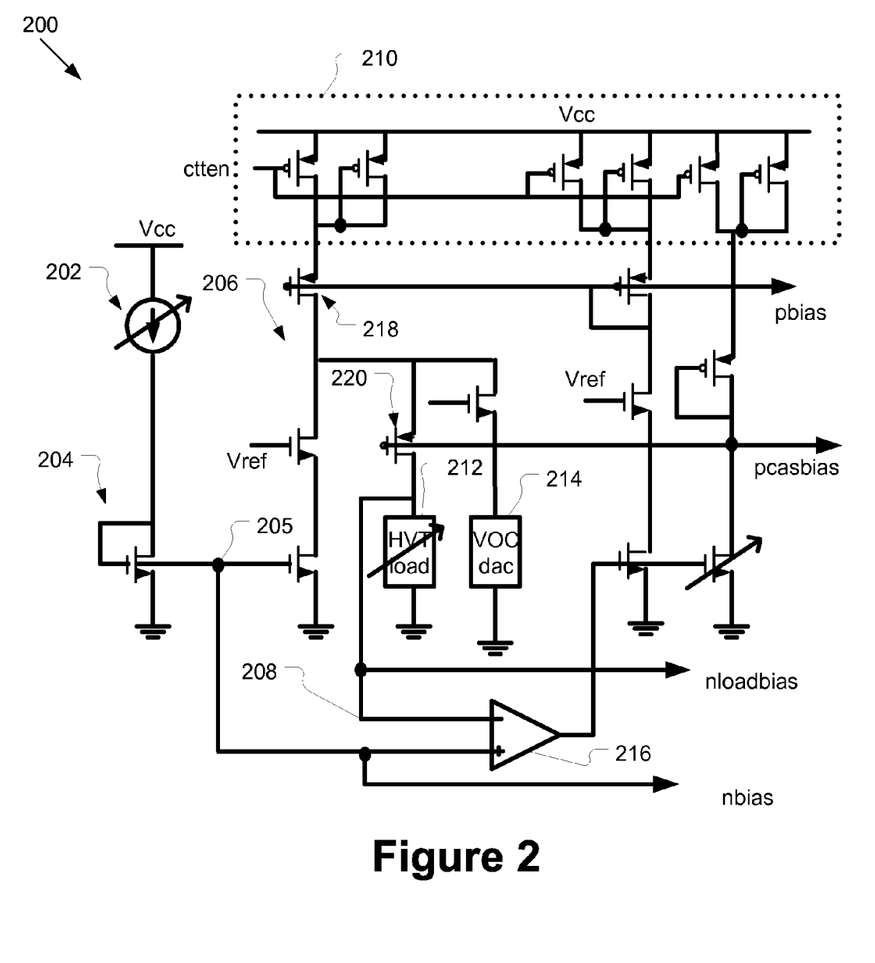
FIG. 2 illustrates an example bias circuit, in accordance with various embodiments.

In various embodiments, the pbias voltage, nbias voltage, pcasbias voltage, and nloadbias voltage used by the circuit 100 may be generated by a bias block to achieve a substantially constant value for the second DC average voltage level. FIG. 2 illustrates an example bias block 200 in accordance with various embodiments. In some embodiments, the bias block 200 may provide bias voltages for a plurality of memory receiver circuits including the circuit 100.

Bias block 200 includes a current generator 202 that produces a reference current. The current generator may also include a digital-to-analog converter (DAC) to convert a digital control signal into the reference current. The reference current may be fed through a diode-connected transistor 204 to produce the nbias voltage at node 205. The bias block 200 further includes a replica circuit 206 which is a half-replica of circuit 100. The replica circuit 206 produces an output signal at output terminal 208 that has a voltage substantially equal to the second DC average voltage level of the differential output signal produced by circuit 100. In some embodiments, the replica circuit 206 may include a voltage drop block 210 to replicate the voltage drop block 125 of the circuit 100, and/or a VOC block 214 to replicate the VOC circuit 138.

The bias block 200 further includes an operational amplifier (op-amp) 216 that receives the output signal of the replica circuit 206 and compares it to the nbias voltage. An output of the op-amp 216 is fed back through the replica circuit 206 so that the voltage of the node 208 of the replica circuit 206 is substantially equal to the nbias voltage. The nbias voltage is passed to the circuit 100 to control the current source 126. The output signal of the replica circuit 206 is passed to the circuit 100 as the nloadbias voltage to control the load transistors 116a-b. The replica circuit 206 further includes a p-type transistor 218 to generate the pbias voltage and a cascode transistor 220 to generate the pcasbias voltage. The pbias voltage and pcasbias voltage may be passed from the replica circuit 206 to the corresponding locations of the circuit 100. Accordingly, the bias block 200 may adjust the pbias voltage and/or pcasbias voltage to track the differential output signal produced by the circuit 100 so that the second DC average voltage level of the differential output signal is substantially constant over a range of DC average voltage levels for the data signal DQ.

Figure 3:
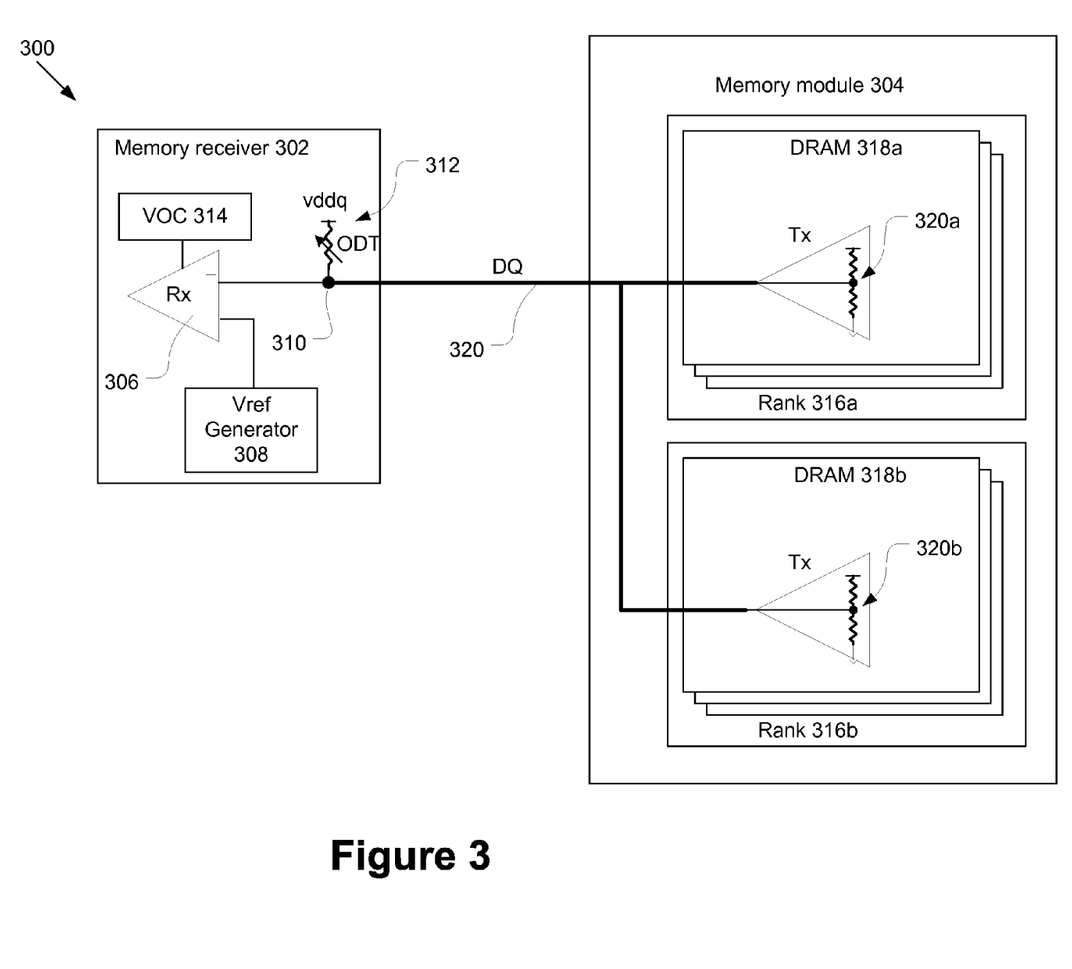
FIG. 3 illustrates an example computing apparatus including a memory receiver circuit and a memory module, in accordance with various embodiments.

FIG. 3 illustrates a computing apparatus 300 that may include a memory receiver 302 coupled to a memory module 304. The memory receiver 302 may be included in a memory controller hub (MCH) of a computing system in some embodiments. The memory receiver 302 may include a receive amplifier 306 configured to receive a data signal DQ from a memory module 304 at an input node 310 of the receive amplifier 306. The receive amplifier 306 may include circuitry similar to the circuit 100 in some embodiments. For example, the receive amplifier 306 may be a differential amplifier.

The memory receiver 302 may further include a reference voltage generator 308 configured to generate a reference voltage Vref. The receive amplifier 306 may generate an output signal that is based on a difference between the data signal DQ and the reference voltage Vref. In some embodiments, the receive amplifier 306 may be a first-stage amplifier of the memory receiver 302, and the output signal of the receive amplifier 306 may be passed to a second-stage amplifier (not shown) of the memory receiver 302.

In some embodiments, the receive amplifier 306 may further include an on-die termination 312 coupled to the input node 310. The on-die termination 312 may reduce reflections and/or otherwise facilitate transmission of the data signal from the memory module 304 to the receive amplifier 306.

In various embodiments, the memory receiver 302 may further include a VOC circuit 314. The VOC circuit 314 may include circuitry similar to the VOC circuit 138 in some embodiments.

In various embodiments, the memory module 304 may include one or more memory ranks 316a-b. The individual memory ranks 316a-b may include one or more memory chips 318a-b. The memory chips 318a-b may be DRAM chips in some embodiments. For example, the memory chips 318a-b may be DRAM chips that operate in accordance with the DDR4 protocol. The memory receiver 302 may receive data signals from either of the memory ranks 316a-b over a common data bus 320. The memory receiver 302 may receive the data signal DQ from only one of the memory ranks 316a-b at a time. Although the memory module 304 is shown in FIG. 3 with two memory ranks 316a-b, other embodiments may include any number of one or more memory ranks.

In various embodiments, the average DC voltage level of the data signal DQ may vary depending on the activated rank (e.g., the rank that is transmitting the data signal DQ) and/or the configuration of the memory module 304. This may be particularly true of DDR4 memory modules. Additionally, or alternatively, the average DC voltage level of the data signal DQ may be different for different memory module manufacturers. For example, different ranks or memory modules may use different values for the on-die termination 312 at the memory receiver 302 and/or a driving source impedance 320a-b at the memory module 304 (e.g., at respective memory ranks 316a-b). These values may help determine the swing level and/or average DC voltage of the data signal DQ.

One method to compensate for the change in average DC voltage level when switching between memory ranks or memory modules is to shift the voltage level of the reference voltage Vref. However, the reference voltage generator 308 may have a long settling time (e.g., due to a high capacitance). Accordingly, it is not feasible to quickly adjust the reference voltage when switching between memory ranks or memory modules.

Accordingly, in various embodiments, the VOC circuit 314 may generate a compensation voltage based on an activated rank or an identity of the memory module. The VOC circuit 314 may apply the compensation voltage to the output signal of the receive amplifier 306 to compensate the output signal for changes in the data signal's average DC voltage level caused by the activated rank or by the configuration of the memory module 304. The compensation voltage may allow the same reference voltage value to be used for a plurality of memory ranks and/or memory modules. Accordingly, the reference voltage may remain constant when switching between memory ranks or memory modules.

In various embodiments, the compensation voltage may include an internal offset voltage and a rank adjustment voltage. The internal offset voltage may be associated with the receive amplifier 306 to account for internal offset in the receive amplifier 306 (e.g., due to silicon offset). The internal offset voltage may be specific to the receive amplifier 306, and may be substantially the same for a given receive amplifier 306 when switching between memory ranks (e.g., memory ranks 316a-b) or memory modules (e.g., memory module 304).

In various embodiments, the rank adjustment voltage may be associated with an individual rank of the memory module (e.g., memory rank 316a or 316b of memory module 304). The memory receiver 302 may determine rank adjustment voltages for a plurality of memory ranks that are coupled with the memory receiver 302. The memory ranks may be associated with the same or different memory modules. In some embodiments, the rank adjustment voltage may be used by a plurality of receive amplifiers 306 of the memory receiver 302.

In various embodiments, during a read operation of the memory receiver 302, the receive amplifier 306 may receive the data signal DQ from an activated memory rank (e.g., memory rank 316a or 316b). The VOC circuit 314 may apply the compensation voltage to the output signal of the receive amplifier 306, with the compensation voltage including the internal offset voltage associated with the receive amplifier 306 and the rank adjustment voltage associated with the activated memory rank.

In some embodiments, the memory receiver 302 may further determine a value of the reference voltage to be provided by the reference voltage generator 308. For example, the memory receiver 302 may be determine an optimal reference voltage for each rank of a plurality of ranks coupled to the memory receiver 302 on a given channel (e.g., coupled with the receive amplifier 306). The memory receiver 302 may then determine the average of the optimal reference voltages of all the ranks. The average optimal reference voltage may be used as the reference voltage for the receive amplifier 306. The compensation voltage for a given rank may then be the difference between the optimal reference voltage for the given rank and the average optimal reference voltage. The use of the average optimal reference voltage may facilitate efficient switching between different memory ranks or memory modules by the memory receiver 302.

Figure 4:
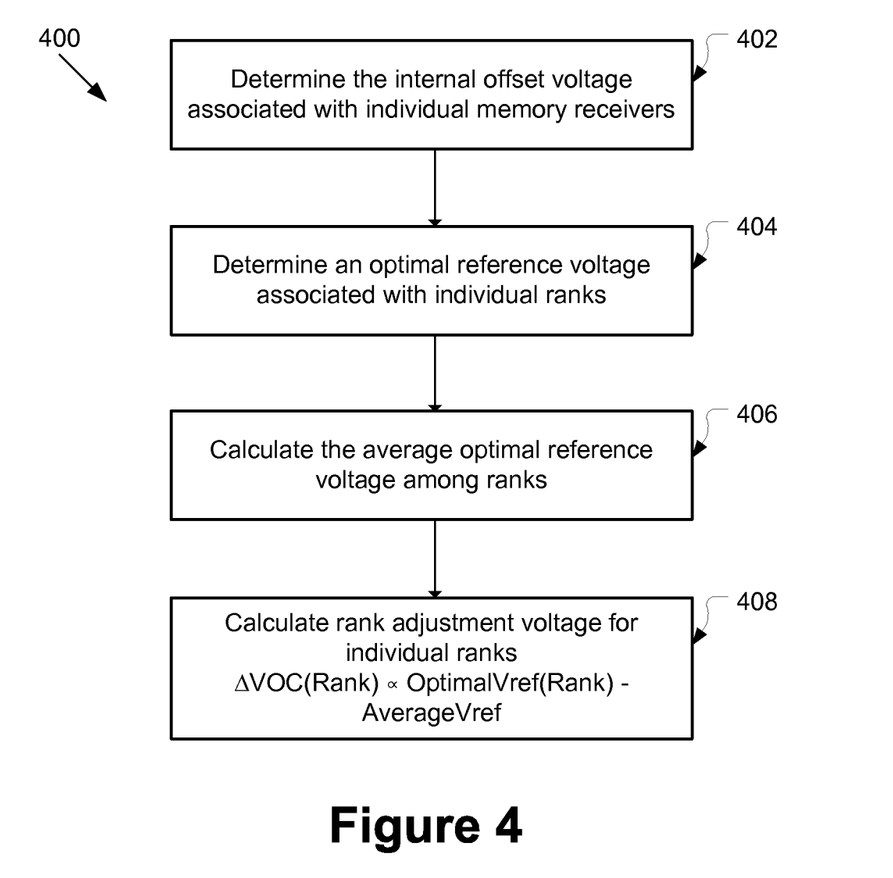
FIG. 4 illustrates an example process for calibrating a voltage offset compensation circuit for a memory receiver, in accordance with various embodiments.

FIG. 4 illustrates a flow chart of a training method 400 that may be used to determine the compensation voltage in accordance with various embodiments. In some embodiments, the training method 400 may be performed by a memory receiver (e.g., memory receiver 302). The memory receiver may include one or more receive amplifiers (e.g., receive amplifier 306) that are configured to receive a data signal from one or more memory modules (e.g., memory module 304) and a reference voltage from a reference voltage generator (e.g., reference voltage generator 308). The receive amplifier may receive the data signal at an input node, and the memory receiver may further include an on-die termination (e.g., on-die termination 312) coupled to the input node.

At block 402, the memory receiver may determine the internal offset voltage associated with the individual memory receivers. The internal offset voltage may compensate, for example, for silicon offset in the memory receiver. The reference voltage may be set to an initial value during block 402. The initial value may be, for example, an ideal value for the reference voltage. The memory receiver may determine the internal offset voltage, for example, by providing an ideal data voltage on the data bus and sweeping the VOC through a range of compensation voltages until the ideal data voltage is substantially equal to the ideal reference voltage (e.g., until the output of the memory receiver changes).

At block 404, the memory receiver may determine an optimal voltage reference for individual ranks of a plurality of ranks of the one or more memory modules. In some embodiments, the plurality of ranks may be associated with a same channel of the memory receiver (e.g., coupled with the same receive amplifier). In some embodiments, the memory receiver may calibrate the receive amplifier to account for the internal offset voltage prior to determining the optimal voltage reference for the individual ranks. For example, the memory receiver may adjust the on-die termination to provide a voltage at the input node that is substantially equal to the initial value of the reference voltage.

In various embodiments, the optimal reference voltage for a given rank may be determined, for example, by activating the rank, and sweeping through a range of values of the compensation voltage provided by the VOC until the output of the receive amplifier changes (e.g., from 1 to 0 or 0 to 1). The optimal reference voltage may be the compensation voltage provided by the VOC when the output of the receive amplifier changes plus the initial value of the reference voltage. This sweeping process may be repeated for additional ranks to determine the optimal voltage references for the plurality of ranks.

In some embodiments, the memory receiver may also determine a timing setting for sampling the data signal, such as a phase interpolator (PI) value, for each of the individual ranks. For example, the memory receiver may detect timing points of the left and right edges of the input signal (e.g., on a 0-to-1-to-0 transition or a 1-to-0-to-1 transition). The optimal sample timing setting may be determined by averaging the timing points of the left and right edges. Other embodiments may use other suitable processes to determine the timing setting.

At block 406, the memory receiver may calculate the average optimal voltage reference among the plurality of ranks. The average optimal voltage reference may be used as the value of the reference voltage during read operations of the memory receiver. The value of the voltage reference may not change when the MCH switches between ranks or memory modules.

At 408, the memory receiver may calculate the rank adjustment voltage for the individual ranks. The rank adjustment voltage for a given rank may be calculated, for example, by subtracting the average optimal voltage reference from the optimal voltage reference for the given rank.

In various embodiments, after determination of the compensation voltage, the memory receiver may receive a data signal from an activated memory rank during a read operation. The VOC circuit may apply the compensation voltage to the output signal of the differential amplifier, with the compensation voltage including the internal offset voltage associated with the receive amplifier and the rank adjustment voltage associated with the activated memory rank.

Figure 5:
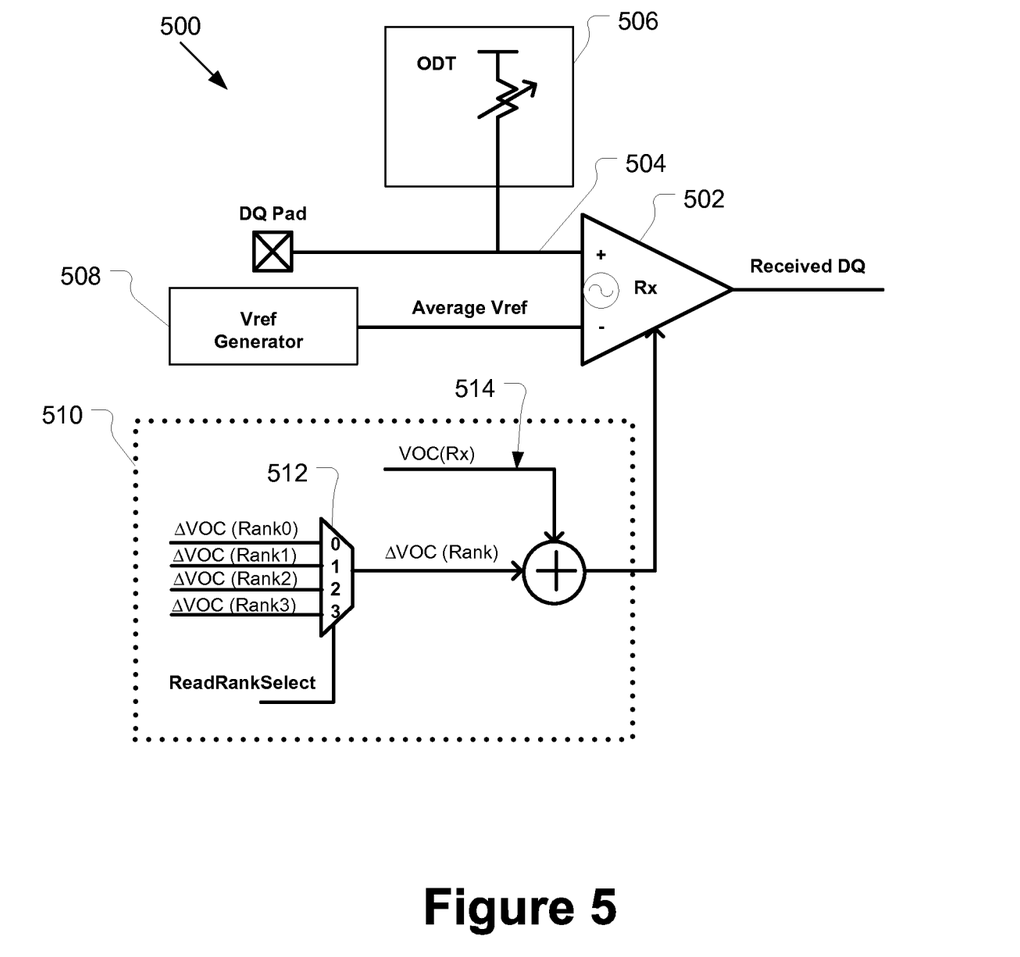
FIG. 5 illustrates an example memory receiver circuit during a read operation, in accordance with various embodiments.

FIG. 5 illustrates an example memory receiver 500 during a read operation in accordance with various embodiments. In some embodiments, the memory receiver 500 may be similar to the memory receiver 302 shown in FIG. 3 and discussed above. For example, the memory receiver 500 may include a receive amplifier 502 configured to receive a data signal DQ from a memory module at an input terminal 504. The memory receiver 500 may further include an on-die termination 506, a reference voltage generator 508, and a VOC circuit 510.

In various embodiments, the VOC circuit 510 may include a buffer 512. The memory receiver 500 may store a rank adjustment value corresponding to the individual rank adjustment voltages in the buffer 512. The memory receiver 500 may further store an internal offset value corresponding to the internal offset voltage in a register 514.

In some embodiments, the rank adjustment value and/or internal offset value may be a set of n bits representing a value from 0 to $2^n-1$. According to one example, the rank adjustment value and/or internal offset value may be 5 bits, representing a value from 0 to 32. A value of 15 may represent a voltage offset of zero volts. Values higher than 15 may increase the voltage offset in successive increments, while values lower than 15 may decrease the voltage offset of successive increments. Any suitable incremental difference between successive values for the rank adjustment value and/or internal offset value may be used.

In various embodiments, the buffer 512 may receive a ReadRankSelect signal to indicate the memory rank that is activated for reading by the memory receiver 500. The buffer 512 may output the rank adjustment value corresponding to the rank adjustment voltage of the activated memory rank. The rank adjustment value may be combined with the internal offset value by adding logic 514 to generate a VOC setting corresponding to the compensation voltage to be applied by the VOC circuit 510.

In some embodiments, the VOC circuit 510 may apply the compensation voltage by controlling individual transistors of a plurality of transistors coupled between the signal path of the output signal and the ground terminal. For example, referring again to FIG. 1, the VOC setting may be used to control the individual transistors of transistor banks 140a and 140b.

Figure 6:
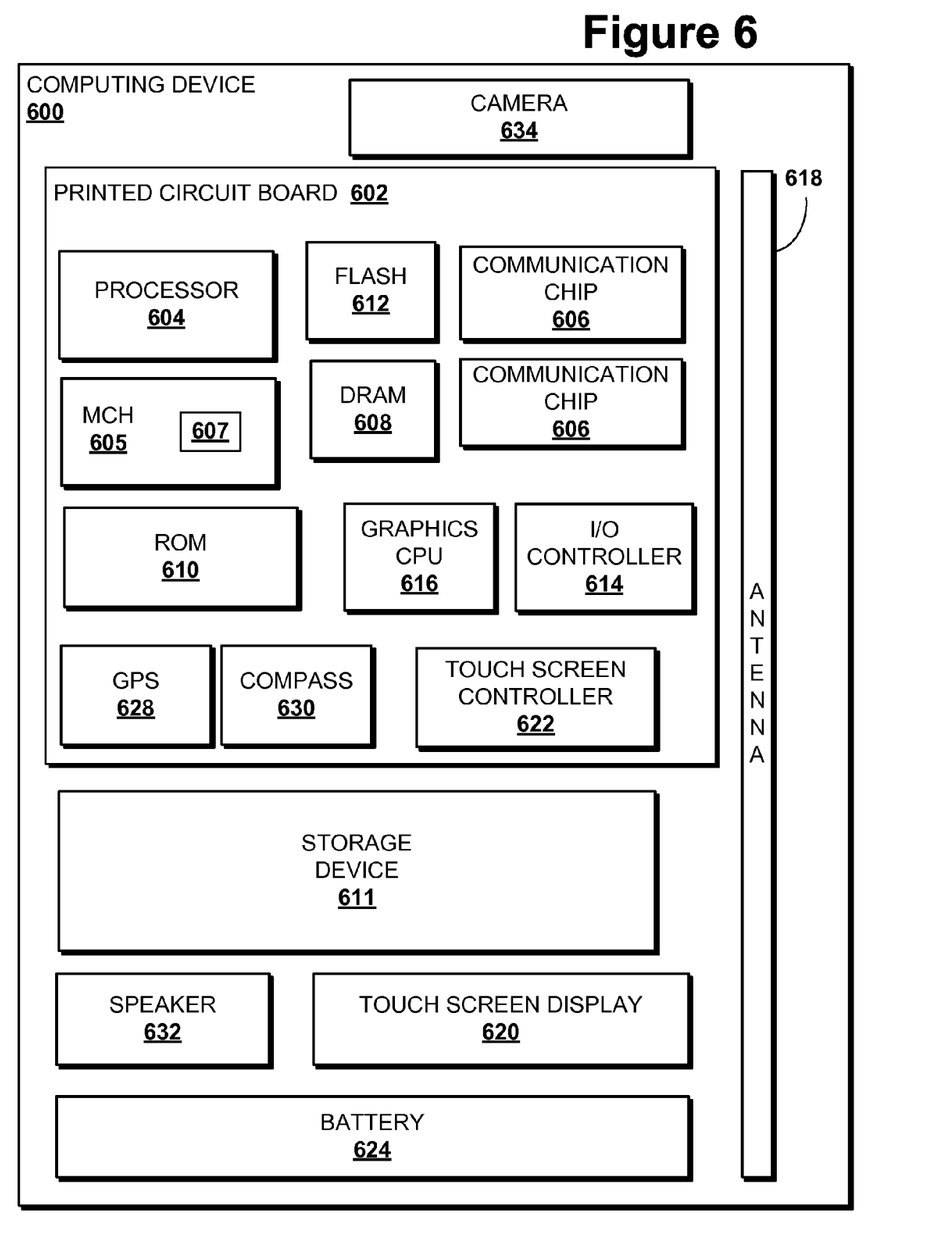
FIG. 6 illustrates an example system configured to employ the apparatuses and methods described herein, in accordance with various embodiments.

FIG. 6 illustrates an example computing device 600 which may employ the apparatuses and/or methods described herein (e.g., memory receiver circuit 100 or 500, bias block 200, method 400), in accordance with various embodiments. Computing device 600 may be an embodiment of computing apparatus 300. As shown, computing device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, memory controller 605, volatile memory (e.g., DRAM 608), non-volatile memory such as read only memory 610 (ROM) and storage device 611 an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as hard disk drive, a solid state drive, compact disk (CD), digital versatile disk (DVD))(not shown), and so forth. In various embodiments, the processor 604 may be integrated on the same die with other components to form a System on Chip (SoC).

In various embodiments, rather than or in addition to storage device 612, computing device 600 may include resident non-volatile memory, e.g., flash memory 612. In some embodiments, the one or more processor(s) 604 and/or flash 612 may include associated firmware (not shown) storing programming instructions configured to enable computing device 600, in response to execution of the programming instructions by one or more processor(s) 604, to practice all or selected aspects of the methods described herein (e.g., method 400). In various embodiments, these aspects may additionally or alternatively be implemented using hardware separate from the one or more processor(s) 604 or flash memory 612.

In various embodiments, MCH 605 may include a memory receiver 607. The memory receiver 607 may include memory receiver circuit 100, 302, and/or 500, and/or the bias block 200 described herein. The memory receiver 607 may be used to read data from the DRAM 608, flash memory 612, and/or storage device 611. In embodiments, the memory receiver 607 may practice method 400.

The MCH 605 and/or memory receiver 607 may additionally or alternatively be included in one or more other components of the computing device 600, e.g., one or more of processors 604.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 600 may be any other electronic device that processes data.

EXAMPLES

Example 1 is an apparatus for reading data from a memory, the apparatus including: a positive supply rail configured to receive a positive supply voltage (Vcc); a differential amplifier coupled to the positive supply rail and including circuitry configured to: receive a data signal at an input terminal of the differential amplifier from a memory, the data signal having a first direct current (DC) average voltage level; pass a differential output signal at a pair of output terminals of the differential amplifier based on a voltage difference between the data signal and a reference voltage; and shift the differential output signal to a second DC average voltage level, wherein the second DC average voltage level is substantially constant over a range of values of the first DC average voltage level.

Example 2 may be the apparatus of Example 1 further including a negative supply rail coupled to the differential amplifier and configured to receive a negative supply voltage (Vss), wherein the first DC average voltage level is referenced to the positive supply voltage and the second DC average voltage is referenced to the negative supply voltage.

Example 3 may be the apparatus of Example 2, further specifying that the negative supply voltage is a ground voltage, and the differential output signal is greater than zero if the data signal is greater than the reference voltage and less than zero if the data signal is less than the reference voltage.

Example 4 may be the apparatus of Example 1, further specifying that the memory is a dynamic random access memory (DRAM), wherein the apparatus is a first stage amplifier of a DRAM receiver, wherein the output terminals are coupled to a second stage amplifier of the DRAM receiver, and wherein the second stage amplifier is configured to operate using a power domain that is different from a power domain of the DRAM.

Example 5 may be the apparatus of Example 1, further specifying that the differential amplifier includes a differential pair of transistors with folded architecture, and wherein the apparatus further includes a bias circuit to generate a plurality of bias voltages for use by the differential amplifier to provide the differential output signal with the second average DC voltage.

Example 6 may be the apparatus of Example 1, further specifying that the differential amplifier includes: a first n-type transistor having a first gate, a first drain, and a first source, the first gate configured to receive the data signal; a second n-type transistor having a second gate, a second drain, and a second source, wherein the second gate is configured to receive the reference voltage and the second source is coupled to the first source at a common node; a controllable current source coupled between the common node and a ground terminal; a first p-type transistor coupled to the first drain of the first n-type transistor; a second p-type transistor coupled to the second drain of the second n-type transistor; a first cascode transistor coupled between the first drain terminal and a first output terminal; a second cascode transistor coupled between the second drain terminal and a second output terminal, wherein the differential amplifier is configured to generate the differential output signal at the first and second output terminals; a first load transistor coupled between the first output terminal and the ground terminal; and a second load transistor coupled between the second output terminal and the ground terminal.

Example 7 may be the apparatus of Example 1, further including a bias circuit coupled to the differential amplifier and configured to generate: a control signal for the current source; a pbias voltage for the first and second p-type transistors; a cascode bias voltage for the first and second cascode transistors; a load bias voltage for the first and second load transistors.

Example 8 may be the apparatus of any of Examples 1 to 7, further including a voltage drop block coupled between the positive supply rail and the differential amplifier to selectively provide a voltage drop from the positive supply rail to the differential amplifier during a first mode.

Example 9 may be the apparatus of any of Examples 1 to 7, further specifying that the memory is a dynamic random access memory (DRAM), and that the differential amplifier is configured to be used with DRAM in accordance with a double data rate (DDR) 3 protocol and with DRAM in accordance with a DDR4 protocol.

Example 10 may be the apparatus of any of Examples 1 to 7, further including a voltage offset compensation (VOC) circuit coupled with the differential amplifier and configured to add a compensation voltage to the differential output signal based on a rank or an identity of the memory.

Example 11 may be a system including a processor coupled to the apparatus of any of the Examples 1 to 10.

Example 12 may be a method including any of the operations performed by the apparatuses of any of Examples 1 to 10.

Example 13 may be an apparatus including one or more means for performing the operations of the method of Example 12.

Example 14 may be an apparatus for reading data from a memory including: a receive amplifier configured to receive a data signal from a memory module and to generate an output signal based on a difference between the data signal and a reference voltage; and a voltage offset compensation (VOC) circuit coupled to the receive amplifier and configured to apply a compensation voltage to the output signal based on an activated rank or an identity of the memory module.

Example 15 may be the apparatus of Example 14, further specifying that the compensation voltage includes an internal offset voltage associated with the receive amplifier and a rank adjustment voltage associated with an individual rank of a plurality of ranks of the memory module.

Example 16 may be the apparatus of Example 15, further specifying that the internal offset voltage is specific to the receive amplifier and that the rank adjustment voltage is to be used by a plurality of receive amplifiers.

Example 17 may be the apparatus of Example 15 or 16, further specifying that the VOC circuit is configured to: determine an optimal reference voltage for individual ranks of a plurality of ranks of the memory module; determine an average optimal reference voltage across the plurality of ranks for the receive amplifier to use as the reference voltage; and determine the rank adjustment voltage associated with individual ranks based on a difference between the optimal reference voltage for the respective rank and the average optimal reference voltage.

Example 18 may be the apparatus of Example 17, further specifying that the receive amplifier is configured to receive the data signal at an input node, the apparatus further comprises an on-die termination coupled to the input node, and the apparatus is configured to calibrate for the internal offset voltage by adjusting the on-die termination to provide a voltage at the input node that is substantially equal to an initial reference voltage.

Example 19 may be the apparatus of Example 15 or 16, further specifying that the VOC circuit is configured to determine the rank adjustment voltage for individual ranks associated with respective ones of a plurality of memory modules.

Example 20 may be the apparatus of Example 19, further specifying that the VOC circuit is configured to: store a rank adjustment value corresponding to the individual rank adjustment voltages in a buffer; store an internal offset value corresponding to the internal offset voltage associated with the receive amplifier; add the internal offset value to the rank adjustment value corresponding to the activated rank of the memory module accessed by the receive amplifier to determine a VOC setting to generate the compensation voltage.

Example 21 may be the apparatus of Example 14, further specifying that the receive amplifier is to pass the output signal on a signal path, and wherein the VOC circuit is configured to apply the compensation voltage by controlling individual transistors of a plurality of transistors coupled between the signal path and a ground terminal.

Example 22 may be a system including a processor coupled to the apparatus of any of the Examples 14 to 21.

Example 23 may be a method including any of the operations performed by the apparatuses of any of Examples 14 to 21.

Example 24 may be an apparatus including one or more means for performing the operations of the method of Example 23.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
  a differential amplifier coupled to a positive supply rail to receive a positive supply voltage (Vcc) and including circuitry to:
    receive a data signal at an input terminal of the differential amplifier from a memory, the data signal having a first direct current (DC) average voltage level, wherein the data signal changes between a first voltage level to represent a first logical value and a second voltage level to represent a second logical value, and the first DC average voltage level is an average voltage of the first voltage level and the second voltage level;
    pass a differential output signal at a pair of output terminals of the differential amplifier based on a voltage difference between the data signal and a reference voltage; and
    shift the differential output signal to a second DC average voltage level, wherein the second DC average voltage level is substantially constant over a range of voltages of the first DC average voltage level, and wherein the second DC average voltage level is an average voltage of a third voltage level representing the first logical value and a fourth voltage level representing the second logical value.

2. The apparatus of claim 1, wherein the differential amplifier is further coupled to a negative supply rail to receive a negative supply voltage (Vss), wherein the first DC average voltage level is referenced to the positive supply voltage and the second DC average voltage is referenced to the negative supply voltage.

3. The apparatus of claim 2, wherein the negative supply voltage is a ground voltage, and the differential output signal is greater than zero if the data signal is greater than the reference voltage and less than zero if the data signal is less than the reference voltage.

4. The apparatus of claim 1, wherein the memory is a dynamic random access memory (DRAM), wherein the apparatus is a first stage amplifier of a DRAM receiver, wherein the output terminals are coupled to a second stage amplifier of the DRAM receiver, and wherein the second stage amplifier is to operate using a power domain that is different from a power domain of the DRAM.

5. The apparatus of claim 1, wherein the differential amplifier includes a differential pair of transistors with folded architecture, and wherein the apparatus further includes a bias circuit to generate a plurality of bias voltages for use by the differential amplifier to provide the differential output signal with the second DC average voltage level.

6. The apparatus of claim 1, wherein the differential amplifier includes:
- a first n-type transistor having a first gate, a first drain, and a first source, the first gate to receive the data signal;
- a second n-type transistor having a second gate, a second drain, and a second source, wherein the second gate is to receive the reference voltage and the second source is coupled to the first source at a common node;
- a controllable current source coupled between the common node and a ground terminal;
- a first p-type transistor coupled to the first drain of the first n-type transistor;
- a second p-type transistor coupled to the second drain of the second n-type transistor;
- a first cascode transistor coupled between the first drain terminal and a first output terminal;
- a second cascode transistor coupled between the second drain and a second output terminal, wherein the differential amplifier is to generate the differential output signal at the first and second output terminals;
- a first load transistor coupled between the first output terminal and the ground terminal; and
- a second load transistor coupled between the second output terminal and the ground terminal.

7. The apparatus of claim 6, further comprising a bias circuit coupled to the differential amplifier to generate:
- a control signal for the current source;
- a pbias voltage for the first and second p-type transistors;
- a cascode bias voltage for the first and second cascode transistors;
- a load bias voltage for the first and second load transistors.

8. The apparatus of claim 1, further comprising a voltage drop block coupled between the positive supply rail and the differential amplifier to selectively provide a voltage drop from the positive supply rail to the differential amplifier during a first mode.

9. The apparatus of claim 1, wherein the memory is a dynamic random access memory (DRAM), and wherein the differential amplifier is to be used with DRAM in accordance with a double data rate (DDR) 3 protocol and with DRAM in accordance with a DDR4 protocol.

10. The apparatus of claim 1, further comprising a voltage offset compensation (VOC) circuit coupled with the differential amplifier to add a compensation voltage to the differential output signal based on a rank or an identity of the memory.

* * * * *